(12) United States Patent
Zhu et al.

(10) Patent No.: US 8,435,812 B1
(45) Date of Patent: May 7, 2013

(54) METHOD FOR MAKING SOLAR CELL (75) Inventors: Zhen-Dong Zhu, Beijing (CN);
Qun-Qing Li, Beijing (CN); Shou-Shan Fan, Beijing (CN)

(73) Assignees: Tsinghua University, Beijing (CN);
Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/340,649

(22) Filed: Dec. 29, 2011

(30) Foreign Application Priority Data

Oct. 27, 2011 (CN) .......................... 2011 1 0331458

(51) Int. Cl.
*H01L 21/00* (2006.01)

(52) U.S. Cl.
USPC .................. 438/29; 438/43; 438/71; 438/98; 438/701; 257/E31.105

(58) Field of Classification Search ............ 438/71, 438/29, 43, 98, 701; 257/E31.105
See application file for complete search history.

(56) References Cited

U.S. PATENT DOCUMENTS

| | | | | |
|---|---|---|---|---|
| 6,313,397 B1 * | 11/2001 | Washio et al. | ................ | 136/256 |
| 6,825,408 B2 * | 11/2004 | Nagano et al. | ................ | 136/246 |
| 8,035,028 B2 * | 10/2011 | Moslehi | ........................ | 136/255 |
| 8,035,113 B2 * | 10/2011 | Moustakas et al. | ............. | 257/79 |
| 8,288,195 B2 * | 10/2012 | Wang et al. | ...................... | 438/73 |
| 2009/0223558 A1 * | 9/2009 | Sun et al. | ....................... | 136/255 |
| 2009/0325336 A1 * | 12/2009 | Abbott et al. | ................... | 438/57 |
| 2012/0167982 A1 * | 7/2012 | Fujishima et al. | ............ | 136/256 |

* cited by examiner

*Primary Examiner* — Michael Trinh
(74) *Attorney, Agent, or Firm* — Altis Law Group, Inc.

(57) ABSTRACT

A method for making a solar cell includes following steps. A silicon substrate is provided, and the silicon substrate has a first surface and a second surface opposite to the first surface. A patterned mask layer is located on the second surface, and the patterned mask layer includes a number of bar-shaped protruding structures aligned side by side. A slot is defined between each two adjacent protruding structures to expose a portion of the second surface of the silicon substrate. The exposed portion of the second surface is etched to form a protruding pair. The mask layer is removed. A doped silicon layer is located on the three-dimensional nano-structures. An upper electrode is applied on at least part of a surface of the doped silicon layer. A back electrode is placed on the first surface of the silicon substrate.

17 Claims, 10 Drawing Sheets

METHOD FOR MAKING SOLAR CELL

CROSS-REFERENCE TO RELATED APPLICATIONS

This application claims all benefits accruing under 35 U.S.C. §119 from China Patent Application No. 201110331458.1, filed on Oct. 27, 2010 in the China Intellectual Property Office, the disclosure of which is incorporated herein by reference. This application is related to applications entitled, "SOLAR CELL", filed filed Dec. 29, 2011, U.S. application Ser. No. 13/340,651.

BACKGROUND

1. Technical Field

The present disclosure relates to a solar cell and a method for making the same.

2. Discussion of Related Art

Solar cells can convert light energy into electrical energy. Solar cells work via photovoltaic effects of the semiconductor materials. Solar cells can be silicon solar cells, gallium arsenide solar cells, or organic thin film solar cells. Among the solar cells, silicon solar cells are the most widely fabricated because of their excellent efficiency in energy conversion and low production cost.

A silicon solar cell generally includes a back electrode, a silicon substrate, a doped silicon layer, and an upper electrode disposed in that sequence. The doped silicon layer is used as a photovoltaic conversion material, and has a smooth surface for extracting sunlight. The silicon substrate and the doped silicon layer can form a number of P-N junctions, which can produce a number of electron-hole pairs under excitation of the sunlight. However, the area of the smooth surface for extracting sunlight is small, thus an extraction light surface of the solar cell has a small area. Furthermore, when the sunlight irradiates the smooth surface, a part of the sunlight is absorbed by the doped silicon layer, and the other part of the light reflected back by the smooth surface cannot be reused. Therefore, the utilization efficiency of the solar cell is relatively low.

What is needed, therefore, is to provide a solar cell with a relatively large extraction light surface, and a method for making the same.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
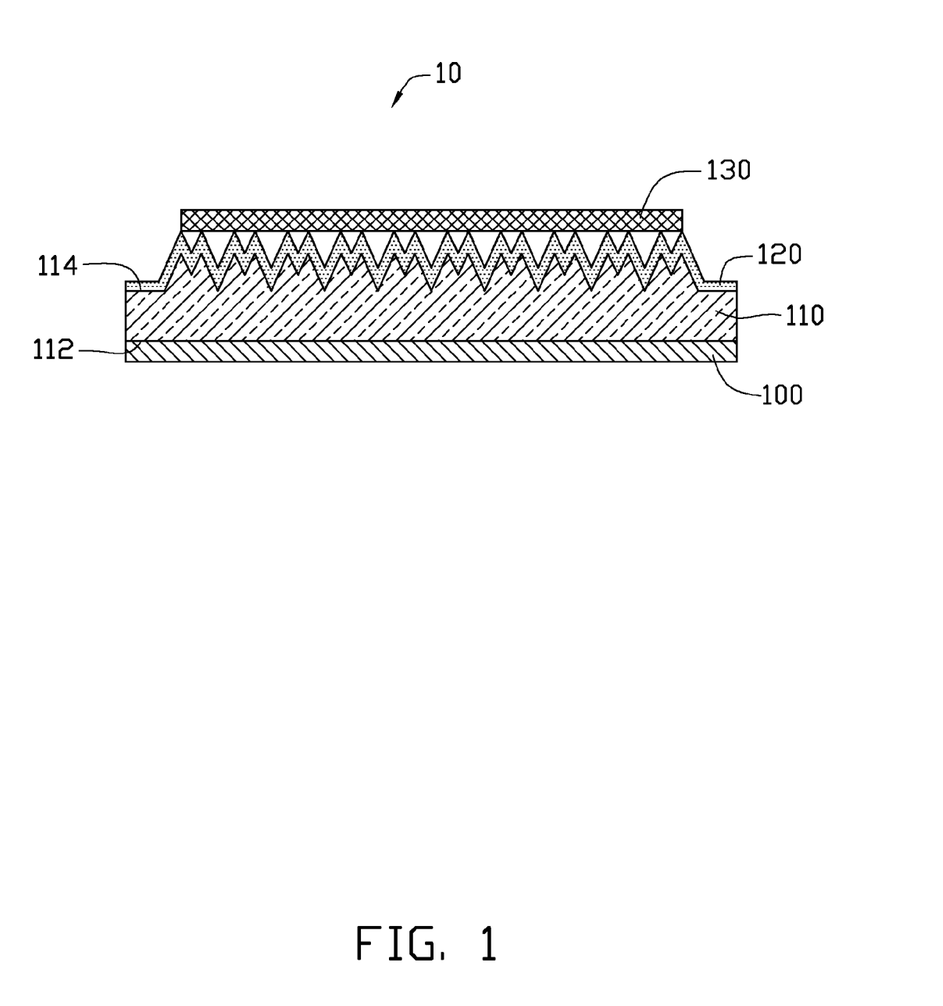
FIG. 1 is a schematic view of one embodiment of a solar cell including a silicon substrate.

Referring to FIG. 1, one embodiment of a solar cell 10 is provided. The solar cell 10 includes a back electrode 100, a silicon substrate 110, a doped silicon layer 120, and an upper electrode 130. The silicon substrate 110, the doped silicon layer 120, and the upper electrode 130 are stacked on a surface of the back electrode 100 in that order. The upper electrode 130 includes a surface for receiving sunlight.

The silicon substrate 110 includes a first surface 112 and a second surface 114 opposite to the first surface 112, and a number of three-dimensional nano-structures 113 located on the second surface 114. A cross-section of each of the three-dimensional nano-structure 113 is M-shaped. The first surface 112 is electrically connected with the back electrode 100. The second surface 114 is adjacent to the upper electrode 130. The doped silicon layer 120 is attached on the three-dimensional nano-structures 113. The upper electrode 130 is located on at least a part surface of the doped silicon layer 120.

The back electrode 100 can be made of silver, aluminum, or magnesium. A thickness of the back electrode 100 ranges from about 10 micrometers to about 300 micrometers. In one embodiment, the back electrode 100 is an aluminum foil with a thickness of about 200 micrometers.

The silicon substrate 110 can be a P-type silicon substrate. A material of the silicon substrate 110 can be a single crystal silicon, multiple crystal silicon, and other P-type semiconductor material. In one embodiment, the silicon substrate 110 is single crystal silicon. A thickness of the silicon substrate 110 ranges from about 20 micrometers to about 30 micrometers.

Figure 2:
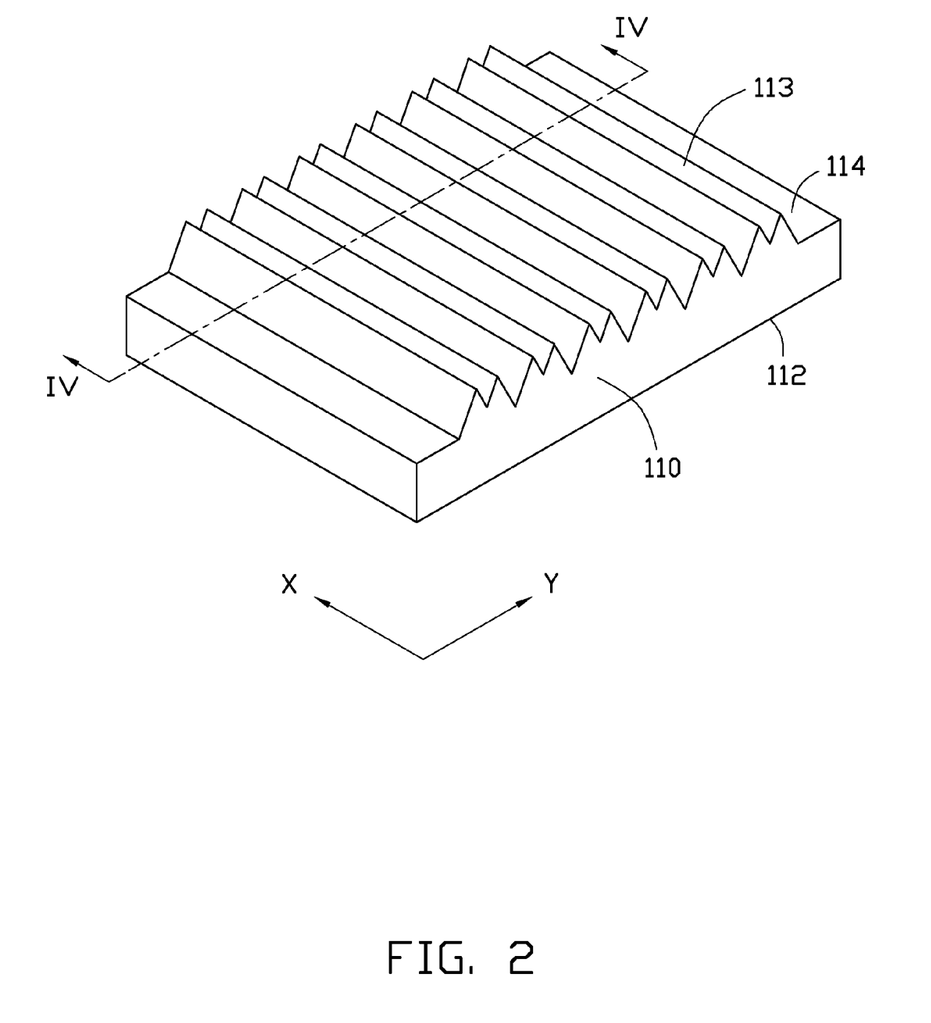
FIG. 2 is a schematic view of the silicon substrate shown in FIG. 1.
Figure 3:
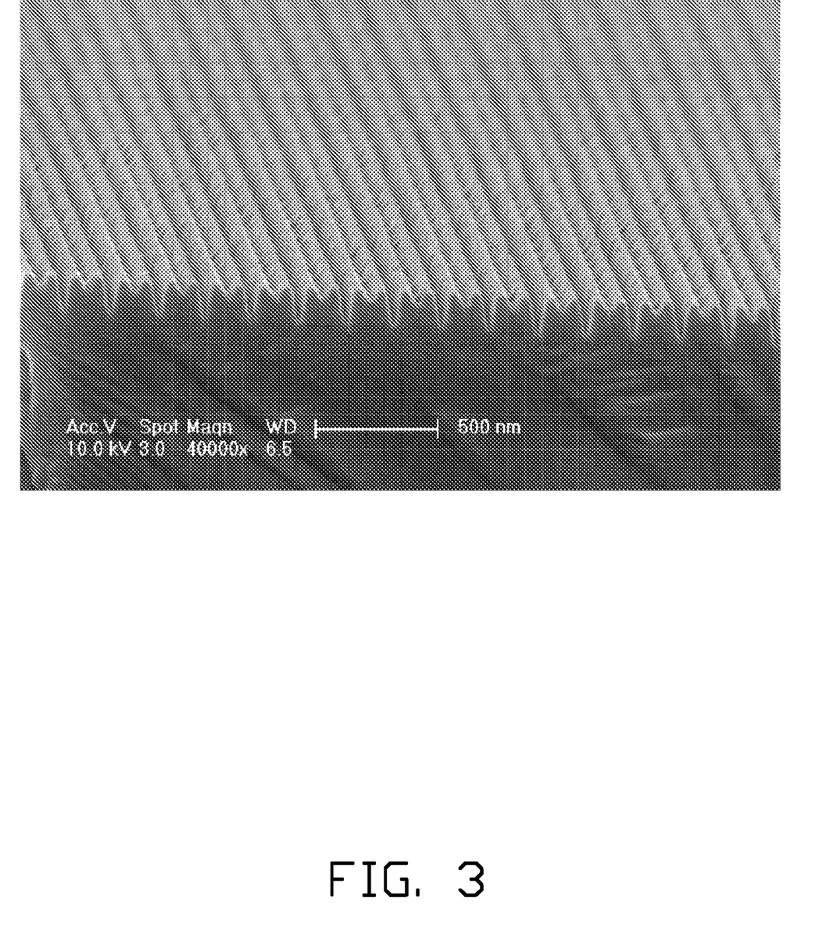
FIG. 3 shows a Scanning Electron Microscope (SEM) image of the silicon substrate shown in FIG. 2.

Referring to FIG. 2 and FIG. 3, the three-dimensional nano-structure 113 can be a protruding structure. The protruding structure protrudes out from the surface of the silicon substrate 110. The material of the three-dimensional nano-structures 113 can be the same as or different from the material of the silicon substrate 110. The three-dimensional nano-structure 113 can be attached on the surface of the silicon substrate 110, and the three-dimensional nano-structure 113 can also be integrated with the silicon substrate 110 to form an integrated structure. The plurality of three-dimensional nano-structures 113 is a protruding structure locating on the surface of the silicon substrate 110.

The plurality of three-dimensional nano-structures 113 can be arranged side by side. Each of the three-dimensional nano-structure 113 can extend along a straight line, a curvy line, or a polygonal line. The extending direction is substantially parallel with the surface of the silicon substrate 110. The two adjacent three-dimensional nano-structures are arranged with a certain interval. The distance ranges from about 0 nanometers to about 200 nanometers. The extending direction of the three-dimensional nano-structure 113 can be fixed or varied. If the extending direction of the three-dimensional nano-structure 113 is fixed, the plurality of three-dimensional nano-structures 113 extends along a straight line. In other cases, the three-dimensional nano-structures 113 extends along a polygonal line or a curvy line. The cross-sectional view of the three-dimensional nano-structure 113 along the extending direction is M-shaped with substantially the same area. Referring to FIG. 3, in one embodiment, the three-dimensional nano-structures 113 are a plurality of bar-shaped protruding structures extending substantially along a straight line and spaced from each other. The plurality of three-dimensional nano-structures 113 are substantially parallel with each other and extend substantially along the same direction to form an array. The plurality of three-dimensional nano-structures 113 are uniformly and equidistantly distributed on the entire surface of the silicon substrate 110.

Figure 4:
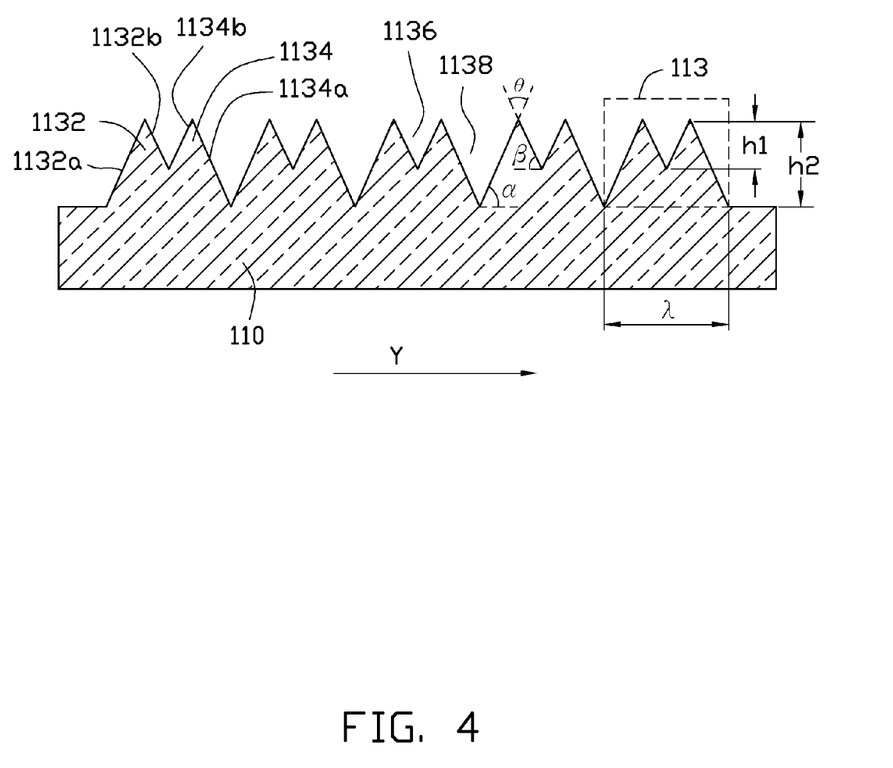
FIG. 4 is a cross-sectional view along a line IV-IV of FIG. 2.

The extending direction of the three-dimensional nano-structure 113 is defined as the X direction, and the Y direction is substantially perpendicular to the X direction and substantially parallel with the surface of the silicon substrate 110. The three-dimensional nano-structure 113 extends from one side of the silicon substrate 110 to the opposite side along the X direction. The three-dimensional nano-structure 113 is a double-peak structure including two peaks. The cross-section of the double-peak structure is M-shaped. Each M-shaped three-dimensional nano-structure 113 includes a first peak 1132 and a second peak 1134. The first peak 1132 and the second peak 1134 extend substantially along the X direction. The first peak 1132 includes a first surface 1132a and a second surface 1132b. The first surface 1132a and the second surface 1132b intersect to form an intersection line and an included angle θ of the first peak 1132. The intersection line can be a straight line, a curvy line, or a polygonal line. The included angle θ is greater than 0 degrees and smaller than 180 degrees. In one embodiment, the included angle θ ranges from about 30 degrees to about 90 degrees. The first surface 1132a and the second surface 1132b can be planar, curvy, or wrinkly. In one embodiment, the first surface 1132a and the second surface 1132b are planar. The first surface 1132a intersects with the surface of the silicon substrate 110 at an angle α. The angel α is greater than 0 degrees and less than or equal to 90 degrees. In one embodiment, the angle α is greater than 80 degrees and less than 90 degrees. The first surface 1132a includes a side connected to the surface of the silicon substrate 110, and extends away from the silicon substrate 110 intersecting with the second surface 1132b. The second surface 1132b includes a side connected with the second peak 1134 and extends away from the silicon substrate 110 at an angle β. The angle β is greater than 0 degrees and smaller than 90 degrees.

The second peak 1134 includes a third surface 1134a and a fourth surface 1134b. The structure of the second peak 1134 is substantially the same as that of the first peak 1132. The third surface 1134a and the fourth surface 1134b intersect with each other to form the included angle of the second peak 1134. The third surface 1134a includes a side intersected with the surface of the silicon substrate 110, and extends away from the silicon substrate 110 to intersect with the fourth surface 1134b. The fourth surface 1134b includes a side intersected with the third surface 1134a to form the included angle of the second peak 1134, and extends to intersect with the second surface 1132b of the first peak 1132 to define a first groove 1136. A second groove 1138 is defined between the two adjacent three-dimensional nano-structures 113. The second groove 1138 is defined by the third surface 1134a of the second peak 1134 and the first surface 1132a of the first peak 1132 of the adjacent three-dimensional nano-structure 113.

The first peak 1132 and the second peak 1134 protrude out of the silicon substrate 110. The height of the first peak 1132 and the second peak 1134 is arbitrary and can be selected according to need. In one embodiment, both the height of the first peak 1132 and that of the second peak 1134 range from about 150 nanometers to about 200 nanometers respectively. The height of the first peak 1132 can be substantially equal to that of the second peak 1134, so that both the first peak 1132 and the second peak 1134 can have the highest point. The highest point of the first peak 1132 and the second peak 1134 is defined as the farthest point away from the surface of the silicon substrate 110. In one three-dimensional nano-structure 113, the highest point of the first peak 1132 is spaced from that of the second peak 1134a certain distance ranging from about 20 nanometers to about 100 nanometers. The first peak 1132 and the second peak 1134 extend substantially along the X direction. The cross-section of the first peak 1132 and the second peak 1134 can be a trapezoid or a triangle, and the shape of the first peak 1132 and the second peak 1134 can be the same. In one embodiment, both the cross-section of the first peak 1132 and the second peak 1134 is in the shape of a triangle. The first peak 1132 and the second peak 1132 form the double-peak structure. In one embodiment, the first peak 1132, the second peak 1134, and the silicon substrate 110 form an integrated structure. Because of the limitation of the technology, the first surface 1132a and the second surface 1132b cannot be absolutely planar.

In each M-shaped three-dimensional nano-structure 113, the first peak 1132, and the second peak 1134 define the first groove 1136. The extending direction of the first groove 1136 is substantially the same as the extending direction of the first peak 1132 and the second peak 1134. The cross-section of the first groove 1136 is V-shaped. The depth $h_1$ of the first groove 1136 in different three-dimensional nano-structures 113 is substantially the same. The depth $h_1$ is defined as the distance between the highest point of the first peak 1132 and the bottom of the first groove 1136. The depth of the first groove 1136 is smaller than the height of the first peak 1132 and the second peak 1134.

The second groove 1138 extends along the extending direction of the three-dimensional nano-structures 113. The cross-section of the second groove 1138 is V-shaped or inverse trapezium. Along the extending direction, the cross-section of the second groove 1138 is substantially the same. The depth $h_2$ of the second grooves 1138 between each two adjacent three-dimensional nano-structures 113 is substantially the same. The depth $h_2$ is defined as the distance between the highest point and the bottom of the second groove 1138. The depth of the second groove 1138 is greater than that of the first groove 1136, and the ratio between $h_1$ and $h_2$ ranges from about 1:1.2 to about 1:3 ($1:1.2 \leq h_1:h_2 \leq 1:3$). The depth of the first groove 1136 ranges from about 30 nanometers to about 120 nanometers, and the depth of the second groove 1138 ranges from about 90 nanometers to about 200 nanometers. In one embodiment, the depth of the first groove 1136 is about 80 nanometers, and the depth of the second groove 1138 is about 180 nanometers. The depth of the first groove 1136 and the second groove 1138 can be selected according to need.

The width of the three-dimensional nano-structure 113 ranges from about 100 nanometers to about 200 nanometers. The width of the three-dimensional nano-structure 113 is defined as the maximum span of the three-dimensional nano-structure 113 along the Y direction. And this span is gradually decreased along the direction away from the silicon substrate 110. Thus in each of the three-dimensional nano-structure 113, the distance between the highest point of the first peak 1132 and that of the second peak 1134 is smaller than the width of the three-dimensional nano-structure 113. The plurality of three-dimensional nano-structures 113 can be distributed with a certain interval, and the interval can be substantially the same. The interval forms the second groove 1138. The distance $\lambda_0$ between the two adjacent three-dimensional nano-structures 120 ranges from about 0 nanometers to about 200 nanometers. The distance between each two adjacent three-dimensional nano-structures 120 can be substantially the same. The distance $\lambda_0$ can be increased with the increase of the height of the first peak 1132 and the second peak 1134, and decreased with the reduction of them. In the Y direction, the distance $\lambda_0$ can be gradually increased, decreased, or periodical varied. If the distance $\lambda_0=0$, the cross-section of the second groove 1138 is V-shaped. If the distance $\lambda_0>0$, the cross-section of the second groove 1138 is in the shape of an inverse trapezium.

Along the Y direction, the plurality of three-dimensional nano-structures 113 is distributed in a certain period P. One period P is defined as the width $\lambda$ of the three-dimensional nano-structures 113 added with the distance $\lambda_0$. The period P of the plurality of three-dimensional nano-structures 113 can range from about 100 nanometers to about 500 nanometers. The period P, the width $\lambda$, and the distance $\lambda_0$ satisfy the following formula: $P=\lambda+\lambda_0$. The period P, the width $\lambda$, and the distance $\lambda_0$ are measured in nanometers. The period P can be a constant, and the $\lambda_0$ or $\lambda$ can be a dependent variable. Furthermore, one part of the three-dimensional nano-structures 113 can be aligned in a first period, and another part of the three-dimensional nano-structures 113 can be aligned in a second period. In one embodiment, the period P is about 200 nanometers, the width $\lambda$ is about 190 nanometers, and the distance $\lambda_0$ is about 10 nanometers.

The doped silicon layer 120 is located on an outer surface of the three-dimensional nano-structures 113. The doped silicon layer 120 is an N-type doped silicon layer. A thickness of the N-type doped silicon layer ranges from about 500 nanometers to about 1 micrometer. The doped silicon layer 120 can be formed by injecting superfluous N-type doped material, such as phosphorus or arsenic, into the second surface 114 of the silicon substrate 110. An interface between the doped silicon layer 120 and the silicon substrate 110 forms a plurality of P-N junctions that can be used to convert solar energy to electrical energy. The three-dimensional nano-structures 113 have the property of photonic crystal. The three-dimensional nano-structures 113 are located on the second surface 114 of the silicon substrate 110, which makes the second surface 114 a larger area. Thus the solar cell 10 can have a large light absorption surface, can increase the photons residence time in the interface, and broaden the frequency range of light absorbed by the three-dimensional nano-structures, thus improving the light absorbing efficiency of the solar cell 10 and the photoelectric conversion efficiency of the solar cell 10.

If the sunlight irradiates side surfaces of the three-dimensional nano-structure 113, a part of the sunlight is absorbed by the three-dimensional nano-structure, and another part of the sunlight is reflected by the three-dimensional nano-structure 113. The sunlight reflected by the three-dimensional nano-structure 113 can irradiate the adjacent three-dimensional nano-structures 113, and a part of the reflected sunlight can be absorbed and another part reflected by the adjacent three-dimensional nano-structures 113. Therefore, the sunlight irradiating on the three-dimensional nano-structures 113 can be reflected and absorbed many times in the three-dimensional nano-structures 113. Thus, the light utilization efficiency of the solar cell 10 can be further improved.

In one embodiment, a part of the upper electrode 130 can directly contact the doped silicon layer 120, and another part of the upper electrode 130 is suspended over the doped silicon layer 120 between adjacent three-dimensional nano-structures 113. In one embodiment, the upper electrode 130 is directly coated on the doped silicon layer 120, and completely contacting the doped silicon layer 120.

The upper electrode 130 is used to collect current produced by the photoelectric conversion in the P-N junctions. The upper electrode 130 is an indium tin oxide layer uniformly coated on the doped silicon layer 120, and contacts the doped silicon layer 120. In other embodiments, the upper electrode 130 can be a carbon nanotube structure composed of a number of carbon nanotubes. The carbon nanotube structure is a freestanding structure without any supporter. The carbon nanotube structure can be at least one carbon nanotube film or at least one carbon nanotube wire drawn from a carbon nanotube array. Examples of the carbon nanotube film and the carbon nanotube wire are taught by U.S. Pat. No. 7,045,108 to Jiang et al., and WO 2007015710 to Zhang et al. The carbon nanotube structure can be partly suspended and partly contact the doped silicon layer 120 by the three-dimensional nano-structures 113. In one embodiment, the upper electrode 130 is a layer of carbon nanotube film and free-standing. The term "free-standing" means that the upper electrode 130 can sustain the weight of itself when it is hoisted by a portion thereof without any significant damage to its structural integrity. The carbon nanotube film is partly suspended and partly contacts the doped silicon layer 120.

The solar cell 10 can further include an intrinsic layer (not shown). The intrinsic layer is located between the silicon substrate 110 and the doped silicon layer 120. The intrinsic layer is made of silicon dioxide ($SiO_2$) or silicon nitride ($Si_3N_4$) as an insulating layer. A thickness of the intrinsic layer is about 1 angstrom to about 30 angstroms. The intrinsic layer is configured to lower the speed of recombination of electron-hole pairs, and further improve the photoelectric conversion efficiency of the solar cell 10.

At the interface of the silicon substrate 110 and the doped silicon layer 120, redundant electrons in the doped silicon layer 120 can move toward the silicon substrate 110, and form an inner electrical field. The orientation of the inner electrical field is from the doped silicon layer 120 to the silicon substrate 110. When the sunlight irradiates the upper electrode 130, a number of electron-hole pairs are produced by the P-N junctions. The electron-hole pairs are separated under the inner electrical field. The electrons in the doped silicon layer 120 move towards the upper electrode 130 and are collected by the upper electrode 130. The holes in the silicon substrate 110 move towards the back electrode 100 and are collected by the back electrode 100. Thus an electric current is formed through an electric circuit outside of the solar cell 10.

Figure 5:
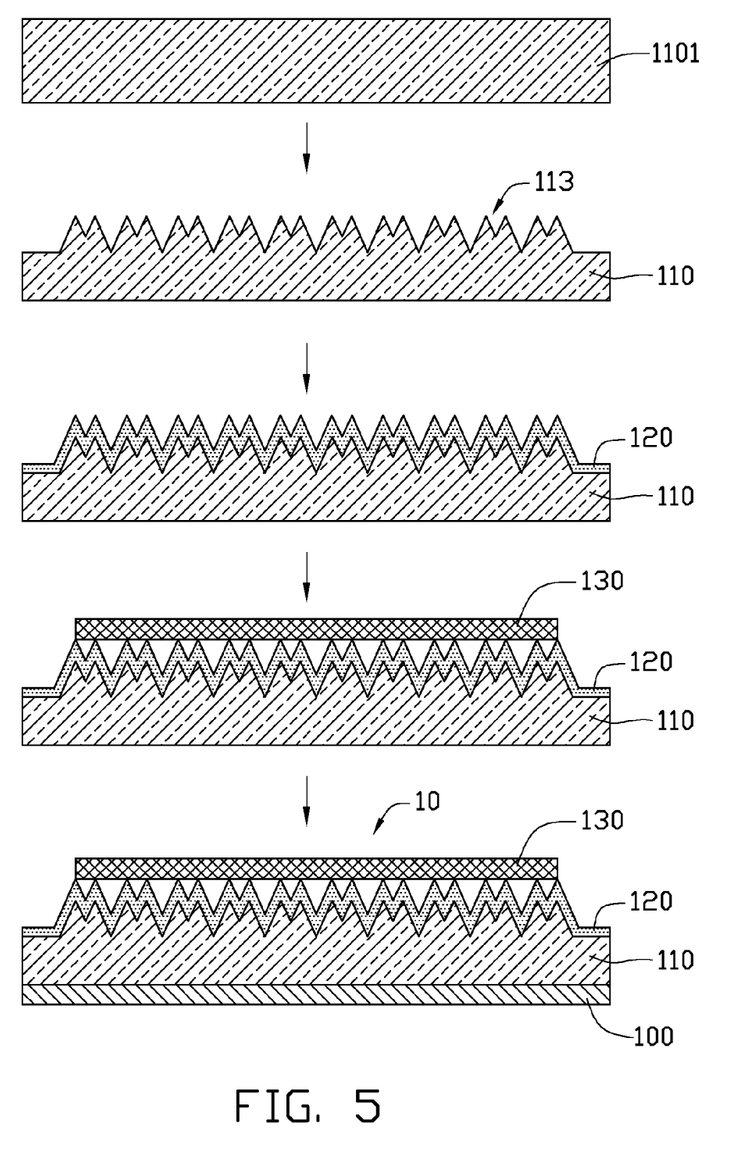
FIG. 5 shows a flowchart of one embodiment of a method for making a solar cell.

Referring to FIG. 5, one embodiment of a method for making the solar cell 10 includes the following steps:

(S10), providing a silicon plate 1101 having a first surface and a second surface opposite to the first surface;

(S11), forming a plurality of M-shaped three-dimensional nano-structures 113 on the silicon plate 1101 to form the silicon substrate 110;

(S12), forming the doped silicon layer 120 on the three-dimensional nano-structures 113;

(S13), applying the upper electrode 130 on at least part of the surface of the doped silicon layer 120; and (S14), placing the back electrode 100 electrically contacting the silicon substrate 110.

In step (S11), the silicon plate 1101 is a P-type semiconductor. A material of the P-type semiconductor can be single crystal silicon, multiple crystal silicon, or other P-type semiconductor materials. In one embodiment, the silicon plate 1101 is a P-type single crystal silicon sheet. A thickness of the silicon plate 1101 can range from about 200 micrometers to about 300 micrometers. A size and the thickness of the silicon plate 1101 can be selected by application.

Figure 6:
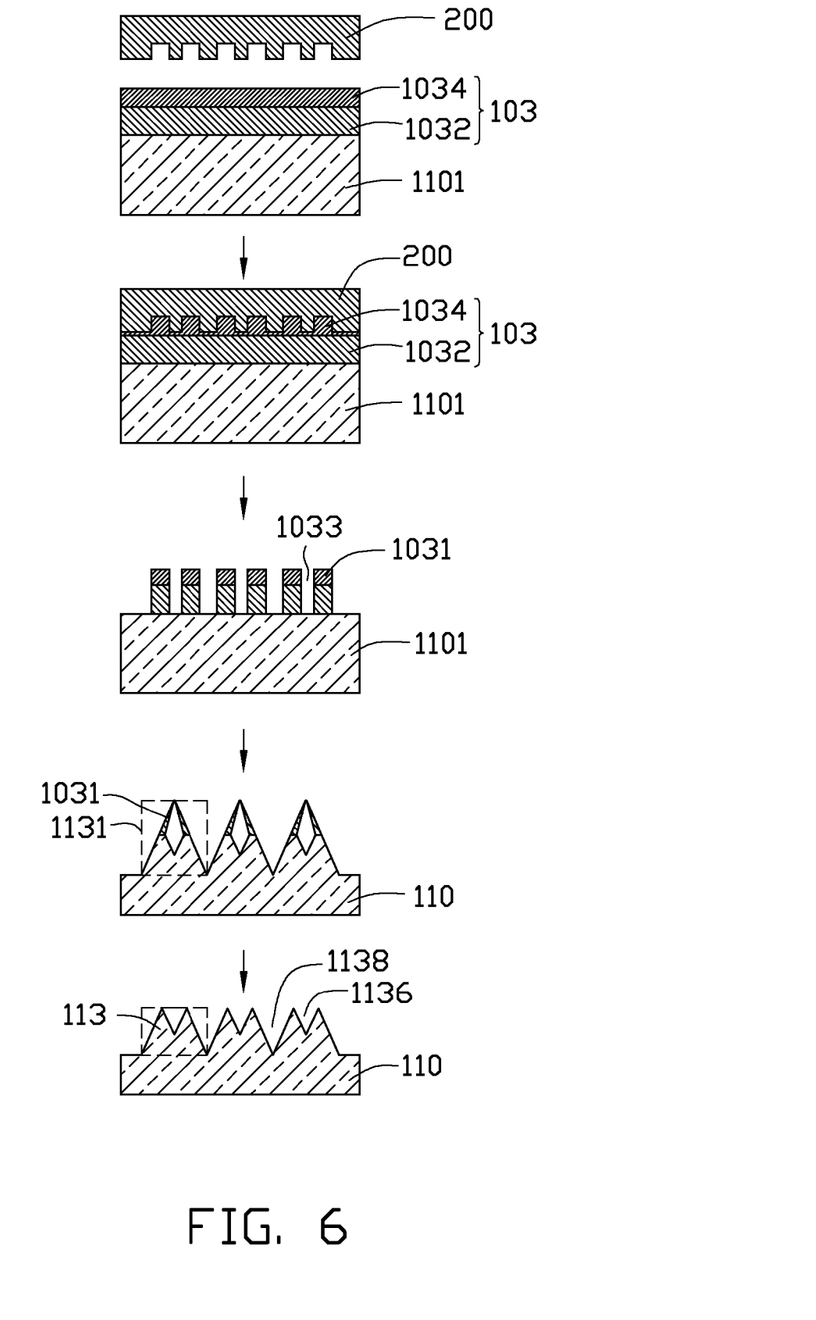
FIG. 6 shows a flowchart of one embodiment of a method for forming a number of three-dimensional nano-structures in the method of FIG. 5.
Figure 7:
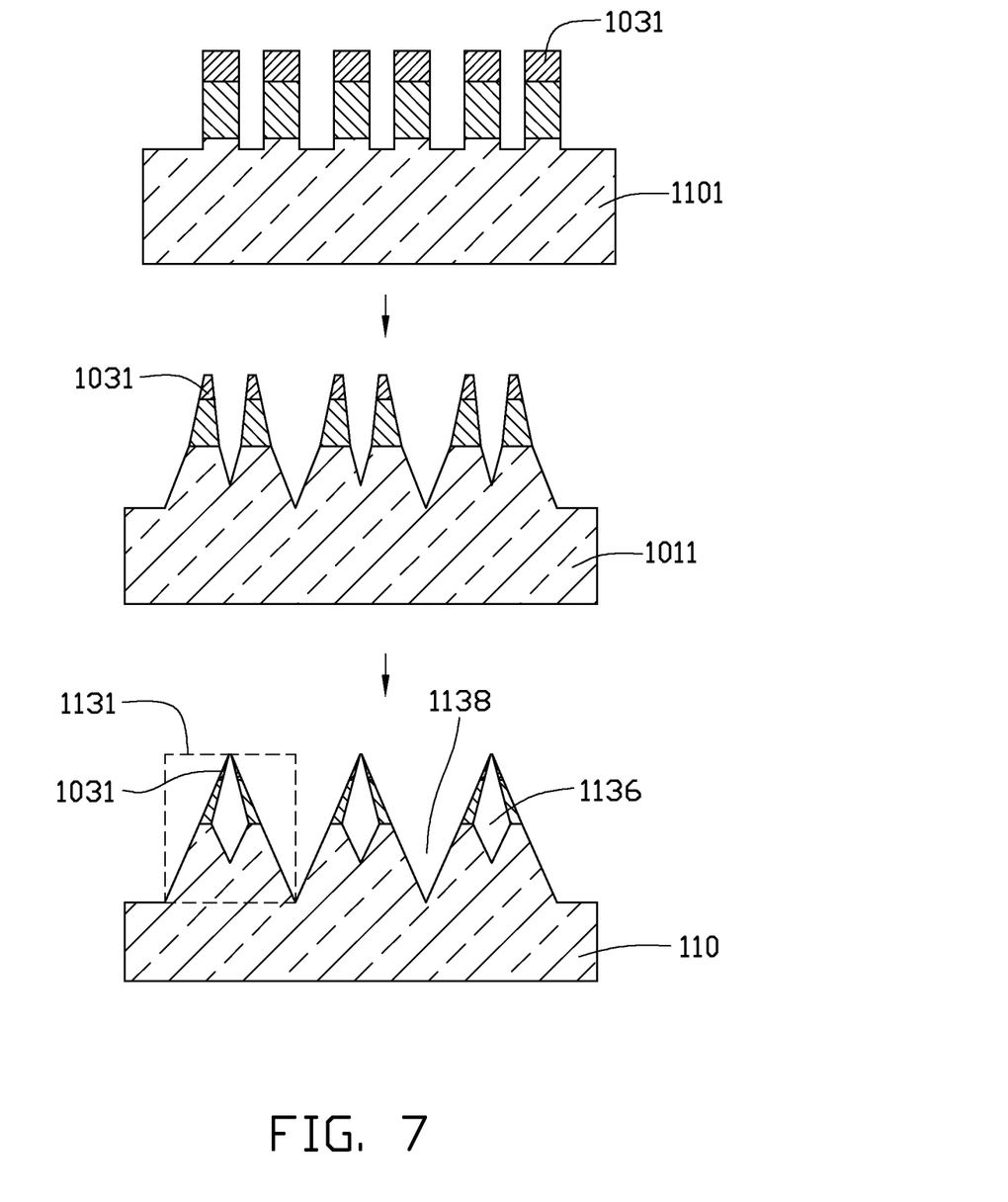
FIG. 7 shows a process of one embodiment of forming a plurality of three-dimensional nano-structure preforms in the method of FIG. 6.

Further referring to FIG. 6 and FIG. 7, the step (S11) can include the following steps:

step (S111), forming a mask layer 103 on a surface of the silicon plate 1101;

step (S112), patterning the mask layer 103 by a nanoimprinting and etching method;

step (S113), patterning the surface of the silicon plate 1101 to form a plurality of three-dimensional nano-structure preforms 1131;

step (S114), forming a plurality of three-dimensional nano-structures 113 by removing the mask layer 103.

In step (S111), the mask layer 103 can be a single layered structure or a multi-layered structure. The thickness of the mask layer 103 can be selected according to the etching depth or the etching atmosphere. If the mask layer 103 is a single layered structure, the material of the mask layer 103 can be ZEP520 which is developed by Zeon Corp of Japan, HSQ (hydrogen silsesquioxane), PMMA (Polymethylmethacrylate), PS (Polystyrene), SOG (silicon on glass), and other silitriangle oligomers. The mask layer 103 is used to protect a portion of the silicon plate 1101. In one embodiment, the mask layer 103 is a multi-layered structure. The mask layer 103 includes a first mask layer 1032 and a second mask layer 1034 stacked on the silicon plate 1101 in that order, and the second mask layer 1034 covers the first mask layer 1032. The first mask layer 1032 and the second mask layer 1034 can be selected according to need. The material of the first mask layer 1032 can be ZEP520, PMMA, PS, SAL601 and ARZ720. The material of the second mask layer 1034 can be HSQ, SOG, and other silitriangle oligomers. The second mask layer 1034 can be easily printed by a mechanical method to ensure the precision of the mask layer 103. In one embodiment, the material of the first mask layer 1032 is ZEP520, and that of the second mask layer 1034 is HSQ. The first mask layer 1032 and the second mask layer 1034 can be formed by a screen printing method or a deposition method.

The step (S111) includes sub-steps of:

step (S111a), forming the first mask layer 1032; and step (S111b), forming the second mask layer 1034.

In step (S111a), the first mask layer 1032 is formed by the following steps. The silicon plate 1101 is cleaned in a clean room. A layer of positive electron-beam resist can be spin-coated on the silicon plate 1101 at a speed of about 500 rounds per minute to about 6000 rounds per minute, for about 0.5 minutes to about 1.5 minutes. The positive electron-beam resist can be ZEP520 resist. The silicon plate 1101 with the positive electron-beam resist can be dried at a temperature of about 140 degrees centigrade to 180 degrees centigrade, for about 3 minutes to about 5 minutes, thereby forming the first mask layer 1032 on the silicon plate 1101. The thickness of the first mask layer 1032 can be in a range of about 100 nanometers to about 500 nanometers.

In step (S111b), the second mask layer 1034 can be a layer of HSQ resist. The HSQ resist is spin-coated on the first mask layer 1032 under high pressure at a speed of about 2500 rounds per minute to about 7000 rounds per minute, for about 0.5 minutes to about 2 minutes. The thickness of the second mask layer 1032 can range from about 100 nanometers to about 300 nanometers. The HSQ can be pressed to be deformed at room temperature. Moreover, the HSQ has good structural stability, and provides a resolution better than 10 nm.

Furthermore, a transition layer (not shown) can be deposited on the first mask layer 1032 before the step of forming the second mask layer 1034. In one embodiment, the transition layer can be a glassy silicon dioxide film with a thickness of about 10 nanometers to about 100 nanometers. The transition layer is used to protect the first mask layer 1032 while nanoimprinting the second mask layer 1034.

In step (S112), the mask layer 103 is patterned by following steps:

step (S112a), providing a patterned template 200;

step (S112b), attaching the template 200 on the second mask layer 1034, and pressing and removing the template 200 to form a plurality of slots on the second mask layer 1034;

step (S113c), removing the residual second mask layer 1034 in the bottom of the slot to expose the first mask layer 1032; and step (S114d), patterning the mask layer 103 by removing one part of the first mask layer 1032 corresponding with the slots.

In step (S112a), the template 200 can be made of rigid materials, such as nickel, silicon, and carbon dioxide. The template 200 can also be made of flexible materials, such as PET, PMMA, polystyrene (PS), and polydimethylsiloxane (PDMS). The template 200 can be fabricated through an electron beam lithography method with the nano-pattern formed therein. The template 200 includes a plurality of protruding structures. The protruding structures are substantially parallel with and spaced from each other to form an array, concentric circles, or concentric rectangles. A slot is defined between the two adjacent protruding structures. The protruding structures form the nano-pattern of the template 200. The nano-pattern can be designed according to the actual application. In one embodiment, the protruding structures are bar-shaped extending substantially along the same direction. The width of the protruding structure and that of the slot can be same. In one embodiment, both the width of the protruding structure and that of the slot range from about 50 nanometers to about 200 nanometers.

In step (S112b), the template 200 is then pressed towards the silicon plate 1101 at room temperature. During this process, the protruding structures are pressed into the second mask layer 1034 to form a plurality of slots in the second mask layer 1034, and some materials of the second mask layer 1034 remain at the bottom of the slot. Finally, the template 200 is removed with the nano-pattern remaining in the second mask layer 1034. The nano-pattern of the second mask layer 1034 includes a plurality of second protruding structures and a plurality of slots. The protruding structures in the second mask layer 1034 correspond to the slots in the template 200. The slots in the second mask layer 1034 correspond to the protruding structures in the template 200.

In one embodiment, the template 200 is pressed towards the silicon plate 1101 at room temperature in a vacuum environment of about $1 \times 10^{-1}$ millibars to about $1 \times 10^{-5}$ millibars. The pressure applied on the template 200 is about 2 pounds per square foot to about 100 pounds per square foot. The pressure is applied on the template 200 for about 2 minutes to about 30 minutes. There may be remaining material of the second mask layer 1034 at the bottom of the slots.

In step (S112c), the residual material of the second mask layer 1034 at the bottom of the slots can be removed by plasma etching. In one embodiment, a $CF_4$ reactive plasma etching method can be used to remove the remaining material of the second mask layer 1034 at the bottom of the slots. For example, the silicon plate 1101 with the protruding structures and the slots formed in the second mask layer 1034 can be placed in a $CF_4$ reactive plasma etching system. The $CF_4$ reactive plasma etching system then generates $CF_4$ plasma, and the $CF_4$ plasma moves towards the second mask layer 1034. The material of the second mask layer 1034 remaining at the bottom of the slots will be etched away, so that the first mask layer 1032 correspond to the slots will be exposed. At the same time, the width of the top of the protruding structures in the second mask layer 1034 is decreased during the etching process. However, the nano-pattern in the second mask layer 1034 will be maintained.

In step (S112d), the first mask layer 1032 exposed by the slots can be removed by oxygen plasma etching. For example, the silicon plate 1101 after being treated by step (S112c) can be placed in an oxygen plasma etching system. The power of the oxygen plasma etching system can in a range of about 10 watts to about 150 watts. The speed of the oxygen plasma can be about 2 sccm to about 100 sccm. The partial pressure of the oxygen plasma can be about 0.5 Pa to about 15 Pa. The etching time can be about 5 seconds to about 1 minute. While etching the first mask layer 1032, the first mask layer 1032 exposed by the slots will be removed, and the silicon plate 1101 correspond to the slots will be exposed. The protruding structures in the second mask layer 1034 function as a mask to the oxygen plasma to ensure the resolution of the first mask layer 1032.

During the etching process, the pattern in the second mask layer 1034 will be copied onto the first mask layer 1032 to form a patterned mask layer 103. The patterned mask layer 103 includes a plurality of protruding structures 1031 on the surface of the silicon plate 1101. Each protruding structure 1031 includes the first mask layer 1032 and the second mask layer 1034 stacked together. A slot 1033 is defined between each two adjacent protruding structures 1031, and the surface of the silicon plate 1101 corresponding to the slot 1033 is exposed. During the process of etching the first mask layer 1032, the top of the protruding structures of the second mask layer 1034 will also be partly etched. The nano-pattern in the second mask layer 1034 can still be maintained. Thus, the resolution of the mask layer 103 can be improved.

In step (S113), the silicon plate 1101 after step (S112) can be placed in an inductively coupled plasma device to etch the silicon plate 1101 exposed by the mask layer 103. The etching gas can be selected according to the material of the silicon plate 1101 and the mask layer 103. During the etching process, the surface of the silicon plate 1101 exposed by the slots 1033 of the mask layer 103 will be etched, thereby forming a plurality of grooves in the silicon plate 1101.

Figure 8:
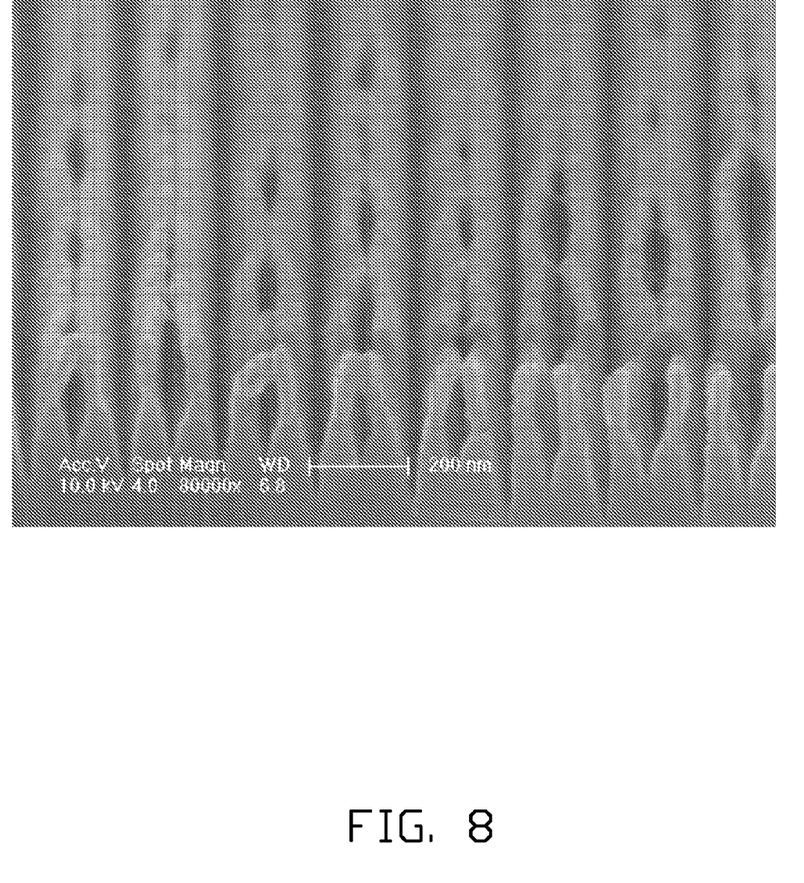
FIG. 8 is a SEM image of a plurality of three-dimensional nano-structure preforms of FIG. 7.

Referring to FIG. 8, the etching process includes the following substeps:

first stage, forming a plurality of grooves with substantially the same depth by etching the surface of the silicon plate 1101 with an etching gas;

second stage, continuing the etching process so that each two adjacent protruding structures 1031 begin to slant face to face to form a plurality of protruding pair; and third stage, continuing the etching process so that the each two adjacent protruding structures 1031 gradually slant until the tops of the two adjacent protruding structures 1031 are contacting each other.

In the first stage, the etching gas etches the exposed surface of the silicon plate 1101 to form a plurality of grooves. The grooves have substantially the same depth because of the same speed of etching.

In the second stage, during the etching process, the etching gas will react with the silicon plate 1101 to form a protective layer. The protective layer will reduce the speed of etching the silicon plate 1101, and the width of the grooves will slowly decrease from the surface to the interior of the silicon plate 1101. Thus the inner wall of the grooves will not be absolutely perpendicular to the surface of the silicon plate 1101, but form an angle. The etching not only etches the silicon plate 1101, but also etches the top of the protruding structures 1031. The width of the top of the protruding structures 1031 will decrease. The resolution of the mask layer 103 will not be affected because the etching speed of the top of the protruding structures 1031 is far smaller than that of the silicon plate 1101. Furthermore, each two adjacent protruding structures 1031 will slant face to face.

In the third stage, the tops of the two adjacent protruding structures 1031 will gradually approach each other. The speed of etching the silicon plate 1101 corresponding to these closed two adjacent protruding structures 1031 will decrease, and the width of the grooves will gradually decrease from the outer surface to the bottom of the grooves. Because the two adjacent protruding structures 1031 slant face to face to form the protruding pair, the speed of etching the silicon plate 1101 corresponding to the protruding pair will further decrease. Eventually, the tops of the two adjacent protruding structures 103 are contacting each other, and the etching gas can no longer etch the silicon plate 1101 corresponding to the two adjacent protruding structures 103, thus the first groove 1026 is formed on the surface of the silicon plate 1101. But between each two adjacent protruding pairs, the etching speed will change less than the slant two adjacent protruding structures 1031. Thus the second grooves 1028 is formed, and the depth of the second grooves 1028 will be greater than that of the first grooves 1026. Thus the plurality of three-dimensional nano-structure preforms 1131 is obtained on the silicon substrate 110.

In one embodiment, the etching gas includes $Cl_2$, $BCl_3$, $O_2$, and Ar. The power of the inductively coupled plasma device ranges from about 10 watts to about 100 watts, the flow speed of the etching gas ranges from about 8 sccm to about 150 sccm, the pressure of the etching gas can range from about 0.5 Pa to about 15 Pa, and the etching time can range from about 5 seconds to about 5 minutes. In the etching gas, the flow speed of the $Cl_2$ ranges about 2 sccm to about 60 sccm, the flow speed of the $BCl_3$ ranges from about 2 sccm to about 30 sccm, the flow speed of the $O_2$ ranges from about 3 sccm to about 40 sccm, and the flow speed of the Ar ranges from about 1 sccm to about 20 sccm. In one embodiment, the flow speed of the etching gas ranges from about 40 sccm to about 100 sccm to improve the resolution and the etching speed. In another embodiment, the power of the inductively coupled plasma device is about 70 watts, the flow speed of the etching gas is about 40 sccm, the pressure of the etching gas is about 2 Pa, and the etching time is about 2 minutes. In the etching gas, the flow speed of the $Cl_2$ is about 26 sccm, the flow speed of the $BCl_3$ is about 16 sccm, the flow speed of the $O_2$ is about 20 sccm, and the flow speed of the Ar is about 10 sccm.

The mask layer 103 and the etching gas are not limited as described above. The etching gas can include one gas or a mixture mixed of different gases, so long as that the tops of the two adjacent protruding structures 1031 in the mask layer 103 can be closed. The flow speed of the etching gas, the pressure, the etching time, and the ratio between the different gases can be dependent upon the three-dimensional nano-structure 113.

In step (S114), the three-dimensional nano-structure 113 can be obtained by dissolving the mask layer 103. The mask layer 103 can be removed by dissolved in a stripping agent such as tetrahydrofuran (THF), acetone, butanone, cyclohexane, hexane, methanol, or ethanol. In one embodiment, the stripping agent is butanone, and the mask layer 103 is dissolved in butanone and separated from the silicon plate 1101. The mask layer 103 is removed to form the silicon substrate 110 and the plurality of three-dimensional nano-structures 113 located on the silicon substrate 110. The plurality of three-dimensional nano-structures 113 and the silicon substrate 110 are integrated to form an integrated structure.

In one embodiment, the step (S12) can further include a step of applying an intrinsic layer on the three-dimensional nano-structure 113, before forming the doped silicon layer 120.

The method for fabricating the three dimensional structure has the following advantages. First, the second mask layer is made from the HSQ resist, which can be imprinted at room temperature, and the HSQ has a small deformation in the subsequent manufacturing process, thereby ensuring the accuracy of subsequent etching. Second, the first mask layer is sandwiched between the substrate and the second mask layer, and the second mask layer will protect the first mask layer in the etching process to ensure good resolution of the first mask layer. Third, the nano-imprinting method can be carried out at room temperature, and the template does not need pre-treatment, thus the method is simple and low cost. Fourth, the plurality of M-shaped three-dimensional structures can be easily formed on the substrate, and the productivity of the solar cell can be improved.

Figure 9:
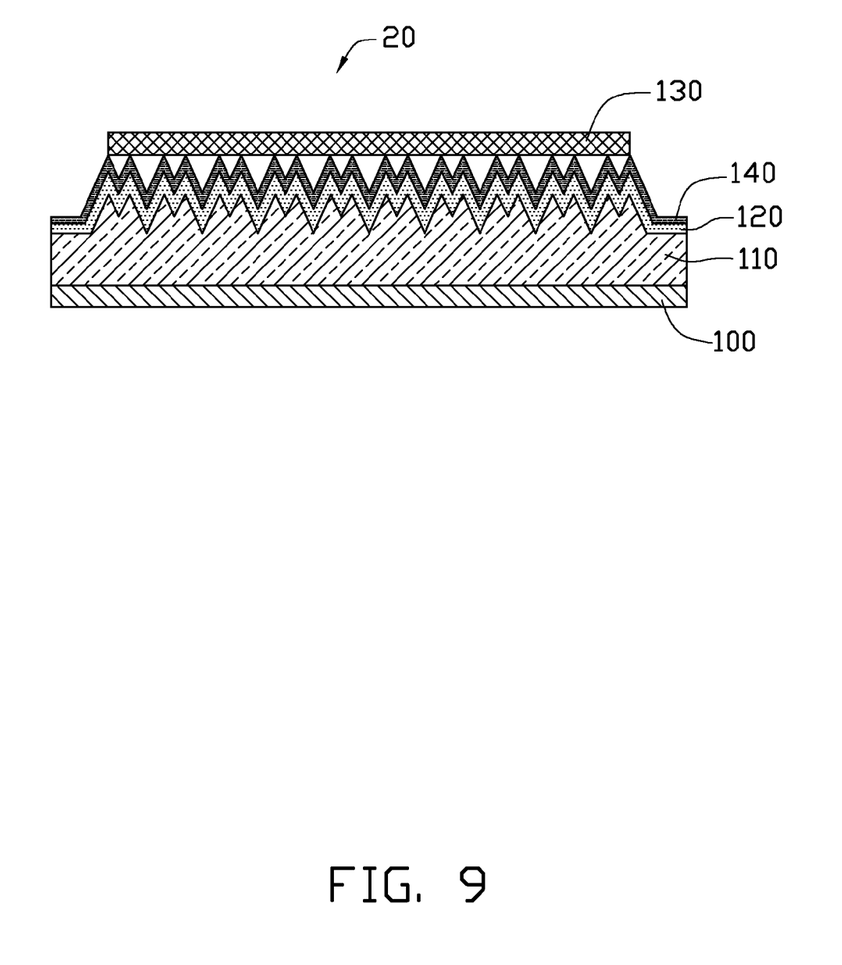
FIG. 9 is a schematic view of one embodiment of a solar cell.

Referring to FIG. 9, one embodiment of a solar cell 20 is provided. The solar cell 20 includes a back electrode 100, a silicon substrate 110, a doped silicon layer 120, and an upper electrode 130. The silicon substrate 110, the doped silicon layer 120 and the upper electrode 130 are stacked on a surface of the back electrode 100 in that order. The upper electrode 130 includes a surface for receiving sunlight. The solar cell 20 is similar to the solar cell 10 except that the solar cell 20 further includes a metal layer 140 attached on an outer surface of the doped silicon layer 120.

The metal layer 140 can be partly or completely contacting the upper electrode 130. The metal layer 140 can be a single layer sheet-structure or a multi-layer sheet-structure, which is formed by a number of nano-scaled metal particles spread out on the doped silicon layer 120. A thickness of the metal layer 140 ranges from about 2 nanometers to about 200 nanometers. A material of the metal layer 140 can be gold, silver, copper, iron, or aluminum. In one embodiment, the metal layer 140 can be a nano-gold layer with a thickness of about 50 nanometers.

The doped silicon layer 120 is coated with the metal layer 140, when the sunlight goes through the upper electrode 130 and irradiates on the metal layer 140, a surface of the metal layer 140 is excited to form a number of plasmas. Therefore, the photon absorption of the doped silicon layer 120 adjacent to the metal layer 140 is improved. In addition, the electromagnetic field produced by the plasmas on the surface of the metal layer 140 can be conductive to separate the electron-hole pairs produced in the P-N junctions under the sunlight.

Figure 10:
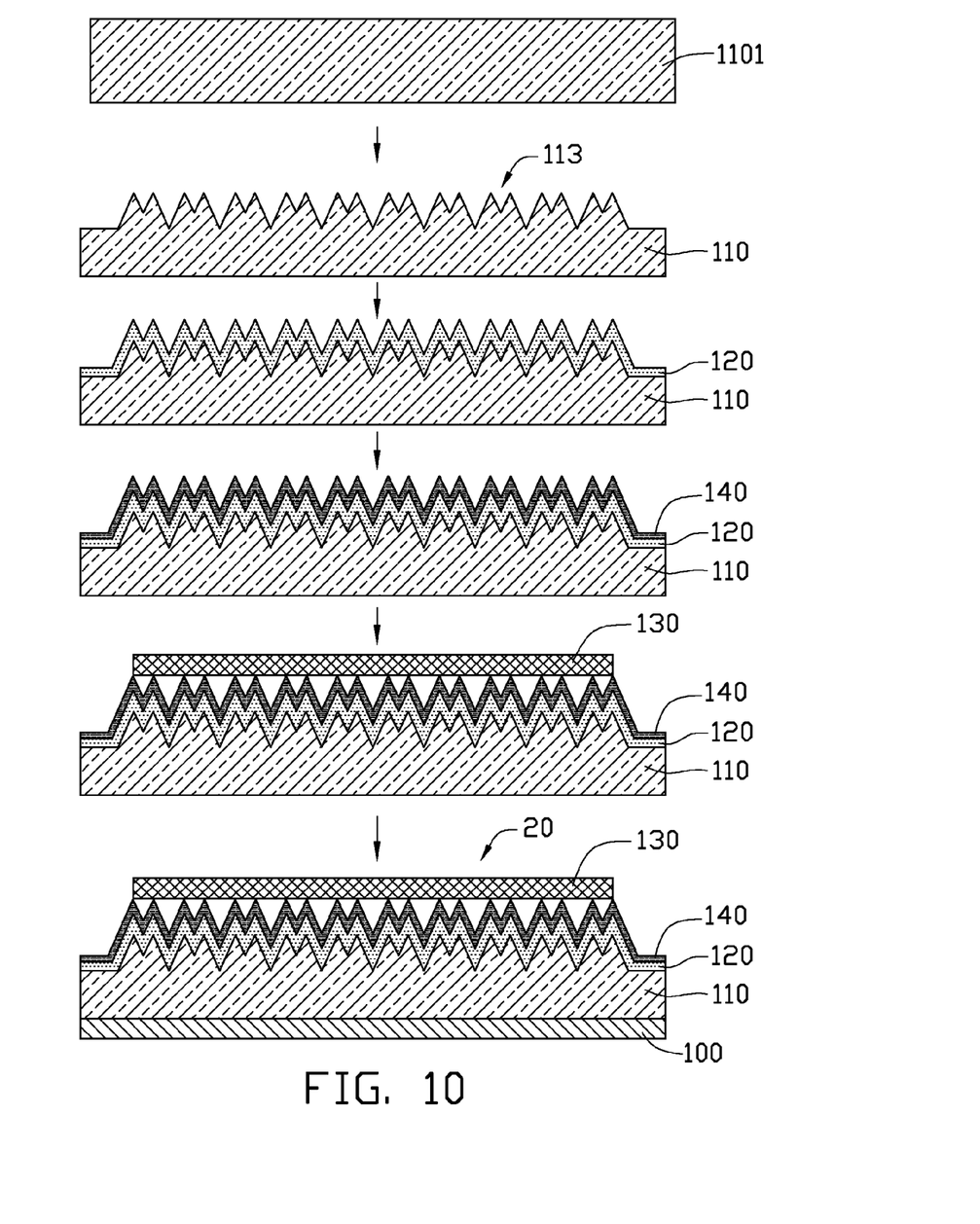
FIG. 10 is a flowchart of one embodiment of a method for making the solar cell shown in FIG. 9.

Other characteristics of the solar cell 20 are the same as the solar cell 10 disclosed above. Referring to FIG. 10, one embodiment of a method for making the solar cell 20 is provided. The method includes the following steps:

(S20), providing a silicon plate 1101 having a first surface and a second surface opposite to the first surface;

(S21), making a plurality of M-shaped three-dimensional nano-structures 113 on the silicon plate 1101 to form the silicon substrate 110;

(S22), forming the doped silicon layer 120 on the three-dimensional nano-structures 113;

(S23), forming the metal layer 140 on the doped silicon layer 120;

(S24), applying the upper electrode 130 on at least part of the surface of the doped silicon layer 120; and (S25), placing the back electrode 100 electrically contacted with the silicon substrate 110.

The method for making the solar cell 20 is similar to the method for making the solar cell 10, except that a step of forming the metal layer 140 on the outer surface of the doped silicon layer 120 is performed. In one embodiment, the metal layer 140 is formed on the outer surface of the doped silicon layer 120 by an electron beam evaporation method. Other characteristics of the method for making the solar cell 20 are the same as the method for making the solar cell 10 disclosed above.

It is to be understood that the above-described embodiment is intended to illustrate rather than limit the disclosure. Variations may be made to the embodiment without departing from the spirit of the disclosure as claimed. The above-described embodiments are intended to illustrate the scope of the disclosure and not restricted to the scope of the disclosure.

It is also to be understood that the above description and the claims drawn to a method may include some indication in reference to certain steps. However, the indication used is only to be viewed for identification purposes and not as a suggestion as to an order for the steps.

What is claimed is:

1. A method for making a solar cell, comprising:
providing a silicon substrate having a first surface and a second surface opposite to the first surface;
locating a patterned mask layer on the second surface, wherein the patterned mask layer comprises a plurality of bar-shaped protruding structures aligned side by side, and a slot is defined between each two adjacent protruding structures of the plurality of bar-shaped protruding structures to expose a portion of the second surface of the silicon substrate;
etching the exposed portion of the second surface, wherein the each two adjacent protruding structures begin to slant face to face until they are contacting each other to form a protruding pair;
forming a plurality of M-shaped three-dimensional nano-structures on the second surface by removing the mask layer;
forming a doped silicon layer on the plurality of three-dimensional nano-structures;
applying an upper electrode on at least part of a surface of the doped silicon layer to electrically contact with the doped silicon layer; and
placing a back electrode on the first surface of the silicon substrate to electrically contact with the silicon substrate.

2. The method of claim 1, wherein the each two adjacent protruding structures gradually slant and tops of the each two adjacent protruding structures gradually approach each other.

3. The method of claim 2, wherein a first part of the silicon substrate corresponding to each of the protruding pairs is etched at a first speed, and a second part of the silicon substrate exposed from the each two adjacent protruding pairs is etched at a second speed, and the first speed is less than the second speed.

4. The method of claim 3, wherein a first groove is defined on the first part of the silicon substrate, and a second groove is defined on the second part of the silicon substrate.

5. The method of claim 4, wherein a depth of the first groove is less than a depth of the second groove.

6. The method of claim 5, wherein the depth of the first groove ranges from about 30 nanometers to about 120 nanometers, and the depth of the second groove ranges from about 100 nanometers to about 200 nanometers.

7. The method of claim 1, wherein the silicon substrate is etched in an inductively coupled plasma device, and a power of the inductively coupled plasma device ranges from about 20 watts to about 100 watts.

8. The method of the claim 7, wherein the silicon substrate is etched by:
   etching the surface of the silicon substrate to form a plurality of grooves with substantially the same depth;
   continuing the etching process so that the each two adjacent protruding structures begin to slant face to face; and
   continuing the etching process so that the each two adjacent protruding structures gradually slant until the tops of the each two adjacent protruding structures are contacting each other.

9. The method of claim 7, wherein an etching gas used for etching comprises $Cl_2$, $BCl_3$, $O_2$ and Ar.

10. The method of claim 9, wherein a flow speed of the etching gas ranges from about 8 sccm to about 150 sccm, a pressure of the etching gas ranges from about 0.5 Pa to about 15 Pa, and an etching time can range from about 5 seconds to about 5 minutes.

11. The method of claim 10, wherein the flow speed of the $Cl_2$ ranges about 2 sccm to about 60 sccm, the flow speed of the $BCl_3$ ranges from about 2 sccm to about 30 sccm, the flow speed of the $O_2$ ranges from about 3 sccm to about 40 sccm, and the flow speed of the Ar ranges from about 1 sccm to about 20 sccm.

12. The method of claim 1, wherein the patterned mask layer is formed by the following steps:
   placing a mask layer on the surface of the silicon substrate;
   forming the plurality of bar-shaped protruding structures aligned side by side by nanoimprinting the mask layer, wherein a slot is defined between each two adjacent protruding structures; and
   exposing the silicon substrate by etching the mask layer through the slot.

13. The method of claim 1, wherein the patterned mask layer is formed by a first mask layer and a second mask layer stacked on the silicon substrate in that order, the material of the first mask layer is different from that of the second mask layer.

14. The method of claim 13, wherein the patterned mask layer is patterned by the following steps:
   providing a template with a plurality of protruding structures aligned side by side and extending substantially along the same direction;
   attaching the template on the second mask layer;
   pressing the template toward the second mask layer and removing the template to form a plurality of slots in the second mask layer;
   exposing the first mask layer by etching the second mask layer on a bottom of the slots through the slots; and
   exposing the silicon substrate by etching the exposed first mask layer.

15. The method of claim 1, wherein the plurality of three-dimensional nano-structures is periodically aligned.

16. The method of claim 15, wherein a period of the plurality of the three-dimensional nano-structures ranges from about 100 nanometers to about 500 nanometers.

17. A method for making a solar cell, comprising:
   providing a silicon substrate having a first surface and a second surface opposite to the first surface;
   forming a plurality of three-dimensional nano-structures on a second surface of the silicon substrate, wherein each of the three-dimensional nano-structures has a first peak and a second peak aligned side by side, a first groove is defined between the first peak and the second peak, a second groove is defined between each two adjacent three-dimensional nano-structures, and a depth of the first groove is less than a depth of the second groove;
   forming a doped silicon layer on the plurality of three-dimensional nano-structures;
   applying an upper electrode on at least part of a surface of the doped silicon layer to electrically contact with the doped silicon layer; and
   placing a back electrode on the first surface of the silicon substrate to electrically contact with the silicon substrate.

* * * * *